United States Patent [19]
Jian et al.

[11] Patent Number: 6,153,961
[45] Date of Patent: Nov. 28, 2000

[54] SURFACE ACOUSTIC WAVE ELEMENT

[75] Inventors: Chunyun Jian; Sinichro Inui, both of Saitama-ken, Japan

[73] Assignee: Mitsubishi Materials Corporation, Tokyo, Japan

[21] Appl. No.: 09/045,914

[22] Filed: Mar. 23, 1998

[30] Foreign Application Priority Data

| Mar. 21, 1997 | [JP] | Japan | ................................. 9-068370 |
| Mar. 24, 1997 | [JP] | Japan | ................................. 9-069620 |
| Jul. 2, 1997 | [JP] | Japan | ................................. 9-177144 |

[51] Int. Cl.$^7$ .................................................. H01L 41/04
[52] U.S. Cl. ...................................... 310/313 A; 310/360
[58] Field of Search .......................... 310/313 A, 313 B, 310/360

[56] References Cited

U.S. PATENT DOCUMENTS

| 5,731,748 | 3/1998 | Tada ........................................ 333/193 |
| 5,917,265 | 6/1999 | Naumenko et al. ................ 310/313 A |
| 6,005,325 | 12/1999 | Inoue et al. ......................... 310/313 A |

FOREIGN PATENT DOCUMENTS

| 10-284982 | 10/1998 | Japan . |
| 2328815 | 3/1999 | United Kingdom . |
| 97/25776 | 7/1997 | WIPO . |

OTHER PUBLICATIONS

"Temperature Stability of SAW on Langasite Single Crystals", Inoue et al, Advanced Products Development Center, TDK Corp. Jul. 1998 IEEE Ultasonics Symposium. pp. 301–306.

"Numerical and Experimental Investigation SAW in Langasite", Yakovkin et al, Jun. 1995 Ultrasonics Symposium. pp. 389–392.

M. F. Dubovnik, et al, 1994 IEEE International Frequency Control Symposium, vol. 48, pp. 43–47, "Langasite ($La_3Ga_5SiO_{14}$), An Optical Piezoelectric: Grouwth and Properties", Jan. 1994.

N. F. Naumenko, National Conference on Acoustoelectronics, 1 page, "Saw and Leaky Waves in a New Piezoelectric Crystal of Langasite", May 23, 1994 (English Abstract only).

S. Sakharov, et al., 1995 IEEE International Frequency Control Symposium, pp. 647–652, "New Data on Temperature Stabilyty and Acoustical Losses of Langasite Crystals", May 1995.

*Primary Examiner*—Nestor Ramirez
*Assistant Examiner*—Peter Medley
*Attorney, Agent, or Firm*—Oblon, Spivak, McClelland, Maier & Neustadt, P.C.

[57] ABSTRACT

A surface acoustic wave element having a cut-out angle from a langasite single crystal and a direction of propagating a surface acoustic wave of ($180°+\alpha$, $40°+\beta$, $20°+\gamma$) in Eulerian angles where $\alpha=-2°$ to $+6°$, $\beta=-4°$ to $+9°$, and $\gamma=-1°$ to $+9°$; of ($0°+\alpha$, $140°+\beta$, $24°+\gamma$) where $\alpha=-6°$ to $+6°$, $\beta=-5°$ to $+5°$, and $\gamma=-5°$ to $+5°$; or of ($9°+\alpha$, $150°+\beta$, $37°+\gamma$) where $\alpha=-5°$ to $+5°$, $\beta=-5°$ to $+5°$, and $\gamma=-5°$ to $+5°$. The element may be used in a filter that selects the frequency used in a communication device or a resonator that is used in a highly stabilized oscillator. The surface acoustic wave element has a chemically stable substrate material, a small temperature coefficient of delay, and a comparatively large electromechanical coupling coefficient.

9 Claims, 7 Drawing Sheets

Changes in K$^2$ and TCD of a cut face of (180°, 35° ~ 45°, 20°)

Changes in K$^2$ and TCD of a cut face of (10°, 146 ~ 156° 37.2°)

Changes in K² and TCD of a cut face of (175°~185°,40°,20°)

Changes in K² and TCD of a cut face of (180°,35°~45°,20°)

Changes in K² and TCD of a cut face of (180°, 40°, 15°~25°)

Temperature dependency of a central frequency
(Central frequency when $f_0$ is at 20°C)

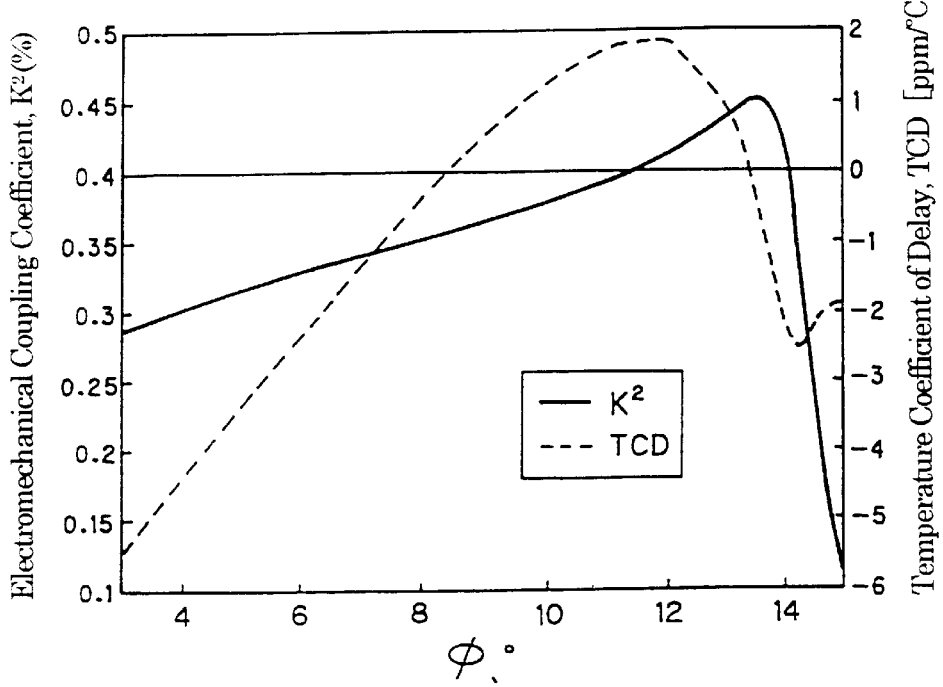
Changes in K² and TCD of a cut face of (3~15°, 150.5°, 37.2°)
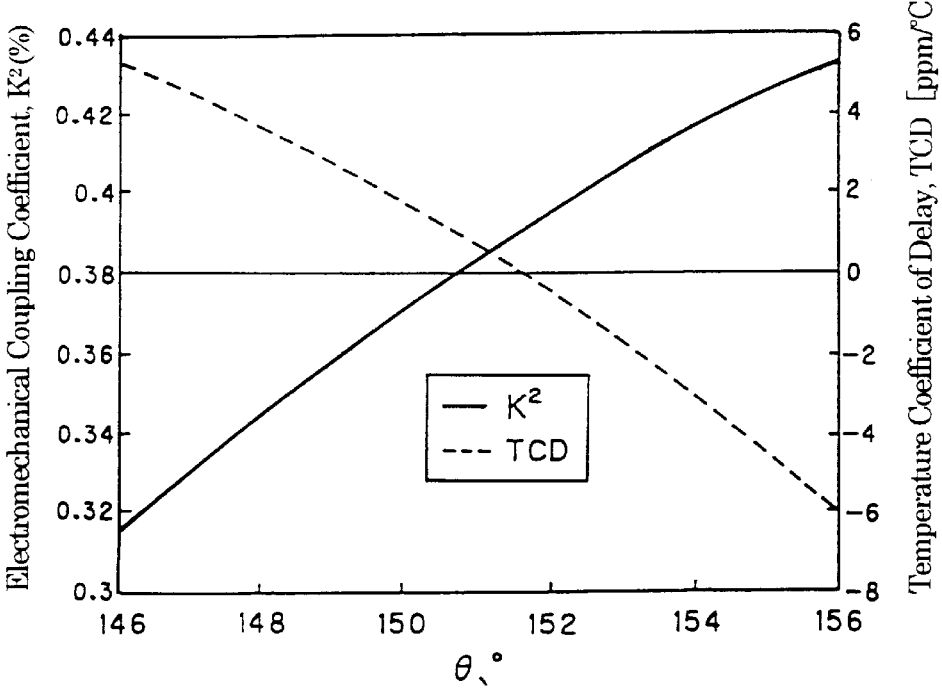
Changes in K² and TCD of a cut face of (10°, 146~156° 37.2°)

Changes in K² and TCD of a cut face of (10°, 150°, 32~42°)

Temperature dependency of a central frequency
(Central frequency when $f_0$ is at 25°C)

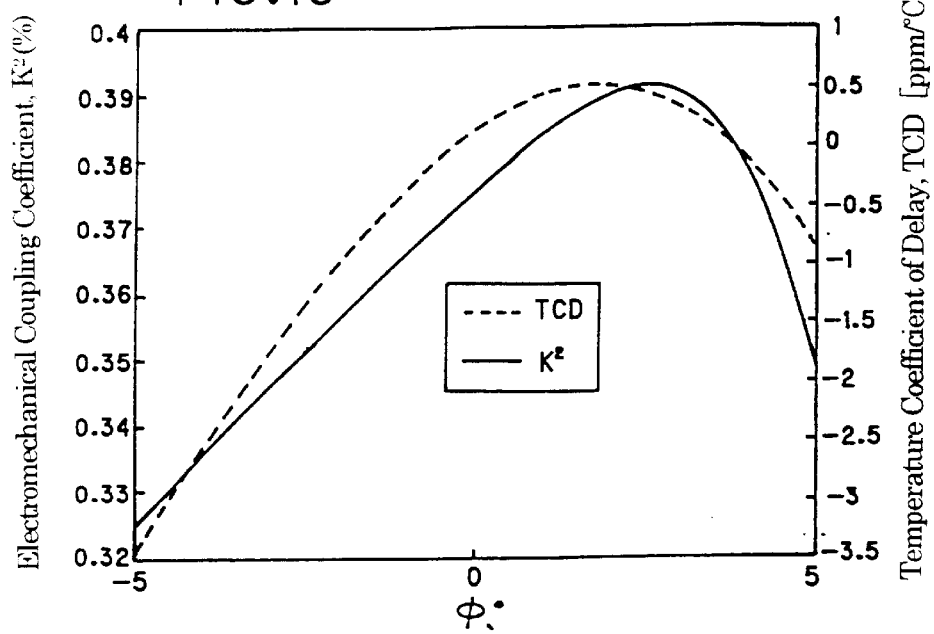
Changes in K² and TCD of a cut face of (−5°, ~5°, 140°, 24°)
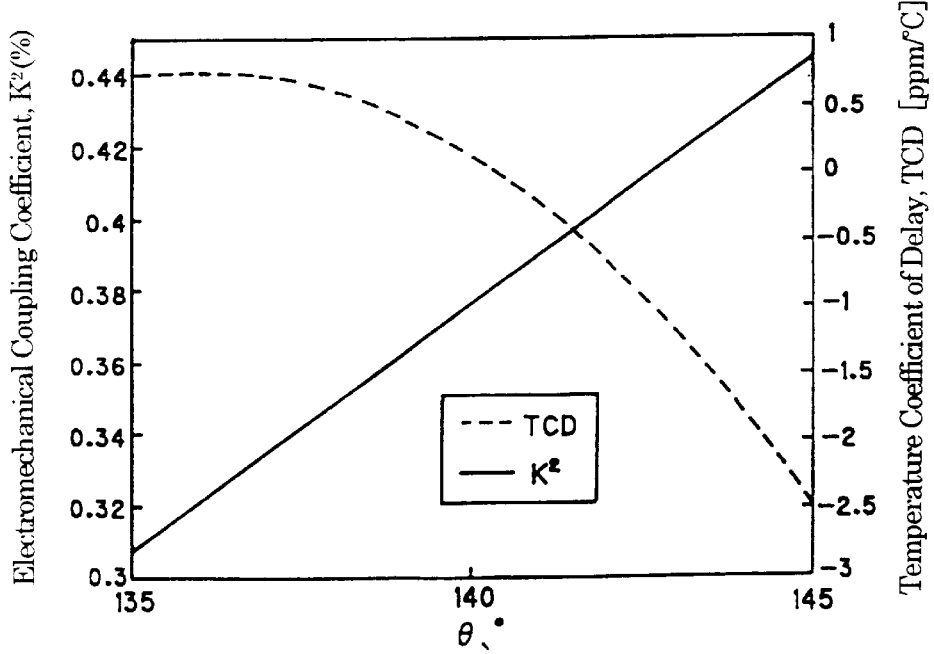
Changes in K² and TCD of a cut face of (0°, 135°~145°, 24°)

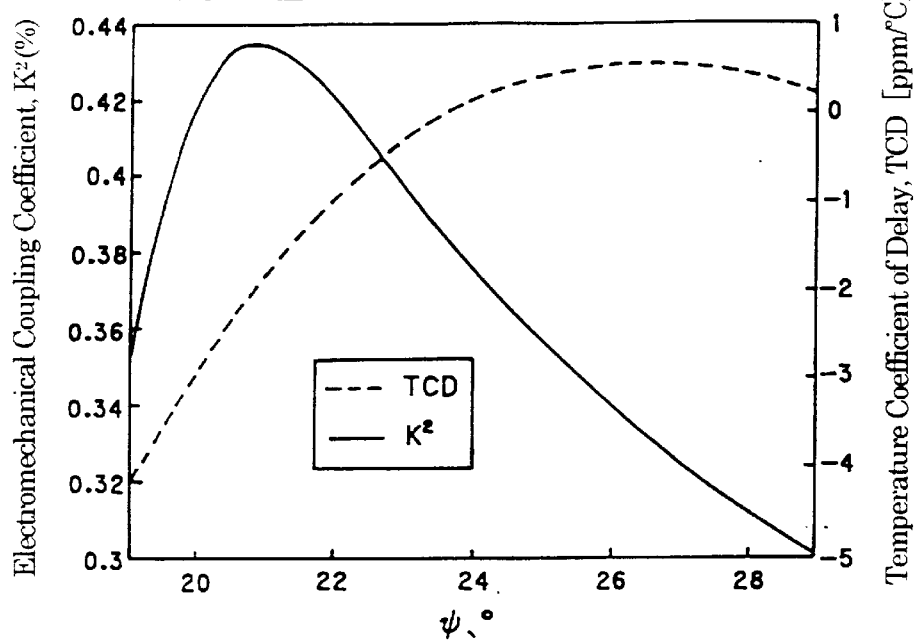
Changes in K² and TCD of a cut face of (0°, 140°, 19°~29°)
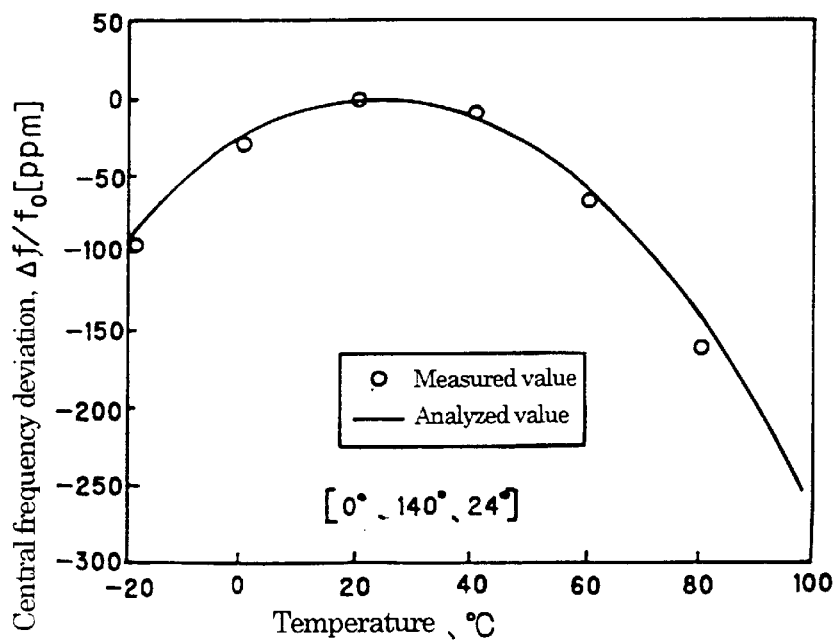
Temperature dependency of a central frequency
(Central frequency when f₀ is at 25°C)

SURFACE ACOUSTIC WAVE ELEMENT

BACKGROUND OF THE INVENTION

1. Field of the Invention

The present invention relates to a surface acoustic wave element used in, for example, a filter for selecting the frequency used in a communication device, or a resonator for an oscillator with high stability.

2. Description of the Related Art

A conventional substrate for a surface acoustic wave element, is typically produced by cutting and polishing a single piezoelectric crystal of lithium niobate, lithium tantalate, lithium tetraborate (see, for example, Japanese Unexamined Patent Publication No. JP-A-60-41315), crystallized quartz, or the like, in accordance with a particular cut face.

Important properties of a piezoelectric substrate used in a surface acoustic wave elements include the temperature coefficient of delay (TCD) and the electromechanical coupling coefficient ($K^2$). It is preferable that a substrate for a surface acoustic wave element have a TCD that is as close to zero as possible and a $K^2$ that is as large as possible.

As stated previously, a conventional substrate for a surface acoustic wave element is typically produced by cutting and polishing a piezoelectric single crystal of lithium niobate ($LiNbO_3$), lithium tantalate ($LiTaO_3$), lithium tetraborate ($Li_2B_4O_7$), crystallized quartz, or the like, by a pertinent cut face. In the case of $LiNbO_3$ (for example, 128° Y cut–X propagation) $K^2$ is as large as 5.5% but TCD is as large as 74 ppm/° C. Accordingly, temperature changes cause the frequency to drift, and the substrate cannot be used in a filter requiring a narrow band characteristic, an oscillator requiring high stabilization, or the like.

Further, in the case of $Li_2B_4O_7$ (for example, 45° X cut–Z propagation), although $K^2$ is 1% and TCD is 0 ppm/° C., the substrate is dissolved in water and it bears a deliquescence property. Accordingly, processing is difficult and reliability is diminished.

Although ST cut crystallized quartz has a TCD of zero, $K^2$ is as small as 0.1%. Therefore, a filter having a wide band cannot be obtained.

Due to the demand for a high performance surface acoustic wave element that outperform conventional devices, a chemically stable substrate material with a TCD near to zero and a large $K^2$ is needed.

SUMMARY OF THE INVENTION

It is an object of the present invention to provide a surface acoustic wave element having a small TCD, a comparatively large $K^2$, and a chemically stable substrate material.

According to a first aspect of the present invention to achieve the above-described objects, a surface acoustic wave element is provided in which a metal film for exciting, receiving, or reflecting a surface acoustic wave is formed on a substrate of single crystal langasite ($La_3Ga_5SiO_{14}$), wherein the cut-out angle from the single crystal of the langasite substrate and the direction of propagating the surface acoustic wave are defined by (180°+α, 40°+β, 20°+γ) in Eulerian angles (Euler angles) where α=−2° to +6°, β=−4° to +9°, and γ=−1° to +9°.

Further, according to a second aspect of the present invention to achieve the above-described object, a surface acoustic wave element is provided in which a metal thin film for exciting, receiving, or reflecting a surface acoustic wave is formed on a substrate of langasite ($La_3Ga_5SiO_{14}$), wherein the cut-out angle from the single crystal of the langasite substrate and the direction of propagating the surface acoustic wave are defined by (9°+α, 150°+β, 37°+γ) in Eulerian angles where α=−6° to 6°, β=−5° to 5°, and γ=−5° to 5°.

According to the surface acoustic wave element of the second aspect of the present invention, it is preferable that the cut-out angle from the single crystal of the langasite substrate and the direction of propagating the surface acoustic wave are defined by (13.4°, 150.5°, 37.2°) in Eulerian angles.

Further, according to a third aspect of the present invention to achieve the above-described object, a surface acoustic wave element is provided in which a metal thin film for exciting, receiving, or reflecting a surface acoustic wave is formed on a substrate of single crystal langasite ($La_3Ga_5SiO_4$), wherein the cut-out angle from the single crystal of the langasite substrate and the direction of propagating the surface acoustic wave are defined by (0°+α, 140°+β, 24°+γ) in Eulerian angles, where α=−5° to 5°, β=−5° to 5°, and γ=−5° to 5°.

According to the surface acoustic wave element of the third aspect of the present invention, it is preferable that the cut-out angle from the single crystal of the langasite substrate and the direction of propagating the surface acoustic wave are defined by (0°, 140°, 24°) in Eulerian angles.

The inventors of the present invention have discovered that a surface acoustic wave element in which a metal film is formed in a propagation orientation at a specific cut face of langasite ($La_3Ga_5SiO_{14}$) which is a single crystal having a piezoelectric character, has a small temperature coefficient of delay, a comparatively large electromechanical coupling coefficient, and is chemically stable.

According to the present invention, there is provided a surface acoustic wave element formed of a chemically stable substrate material having a small temperature coefficient of delay and a comparatively large electromechanical coupling coefficient.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 shows a graph indicating changes in $K^2$ and TCF for a cut face of (3°–15°, 150.5°, 37.2°);

FIG. 7 shows a graph indicating changes in $K^2$ and TCF for a cut face of (10°, 146°–156°, 37.2°);

FIG. 10 shows a graph indicating changes in K² and TCF for a cut face of (−5° to −5°, 140°, 24°);

FIG. 11 shows a graph indicating changes in K² and TCF for a cut face of (0°, 135°–145°, 24°);

FIG. 12 shows a graph indicating changes in K² and TCF for a cut face of (0°, 140°, 19°–29°); and FIG. 13 shows a graph indicating the temperature dependency of a central frequency when $f_o=25°$ C.

DETAILED DESCRIPTION OF THE PREFERRED EMBODIMENTS

Figure 1:
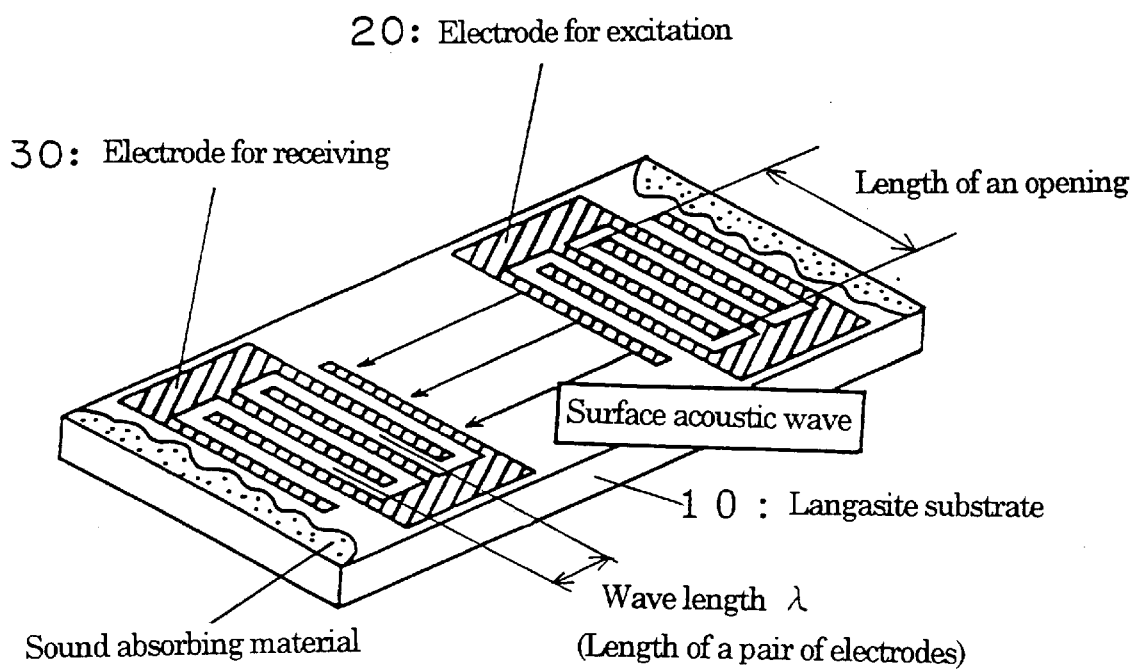
FIG. 1 is a schematic view of a transmission type SAW (Surface Acoustic Wave) filter.

Referring now to the drawings, wherein like reference numerals designate identical or corresponding parts throughout the several views, and more particularly to FIG. 1 thereof, FIG. 1 is a schematic view of a transmission type SAW filter.

When a pair of comb-like electrodes are formed on a langasite single crystal substrate 10 and a high frequency voltage is applied on one of these electrodes (i.e., an electrode for excitation 20), a surface acoustic wave is excited and travels to a receiving electrode 30. A band-pass filter characteristic is produced in the frequency characteristic between an input and an output of these and a temperature characteristic of the filter is determined by a property of the crystal 10.

The constants necessary for calculating the characteristics of the surface acoustic wave on the langasite single crystal—the density, the elastic constant, the piezoelectric constant, the dielectric constant, and the linear expansion coefficient at 20° C.—are shown below in Table 1.

Further, Table 2 shows primary and secondary temperature coefficients thereof.

TABLE 1

Various constants of langasite used in calculations

| Measured temperature ° C. | | 20 |
|---|---|---|
| Density ρ (Kg/m³) | | 5764 |
| Elastic constant, $C^E$ ($10^{10}$ N/m²) | $C^E_{11}$ | 18.93 |
| | $C^E_{12}$ | 10.50 |
| | $C^E_{13}$ | 9.528 |
| | $C^E_{14}$ | 1.493 |
| | $C^E_{33}$ | 26.24 |
| | $C^E_{44}$ | 5.384 |
| | $C^E_{66}$ | 4.216 |
| Piezoelectric constant, e(C/m²) | $e_{11}$ | −0.431 |
| | $e_{14}$ | 0.108 |
| Dielectric constant, $\epsilon^T/\epsilon^O$ | $\epsilon^T_{11}/\epsilon^O$ | 18.97 |
| | $\epsilon^T_{33}/\epsilon^O$ | 52.00 |
| Linear expansion coefficient, λ ($10^{-6}$/K) | $\lambda_{11}$ | 5.07 |
| | $\lambda_{33}$ | 3.60 |

TABLE 2

Temperature coefficients of respective constants of langasite used in calculations

| Measured temperature ° C. | | 20 | |
|---|---|---|---|
| | | Primary coefficient ($10^{-5}$/K) | Secondary coefficient ($10^{-9}$/K) |
| Elastic constant, $C^E$ ($10^{10}$ N/m²) | $C^E_{11}$ | −53 | −4.2 |
| | $C^E_{12}$ | −92 | +25 |
| | $C^E_{13}$ | −88 | −131 |
| | $C^E_{14}$ | −205 | +870 |
| | $C^E_{33}$ | −104 | −109 |
| | $C^E_{44}$ | −62 | −111 |
| | $C^E_{66}$ | −4.7 | −40.7 |
| Piezoelectric constant, e(C/m²) | $e_{11}$ | 456 | 1032 |
| | $e_{14}$ | −628 | 1480 |
| Dielectric constant, $\epsilon^T/\epsilon^O$ | $\epsilon^T_{11}/\epsilon^O$ | 137 | 82 |
| | $\epsilon^T_{33}/\epsilon^O$ | −795 | 1076 |

Figure 2:
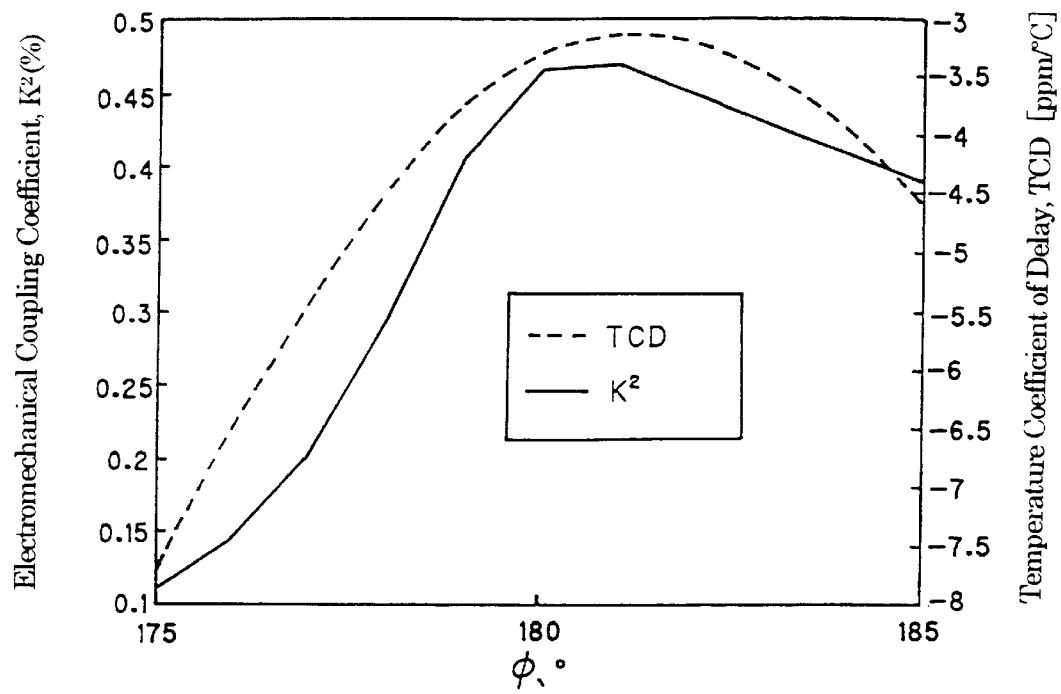
FIG. 2 shows a graph indicating changes in $K^2$ and TCD for a cut face of (175°–185°, 40°, 20°)
Figure 3:
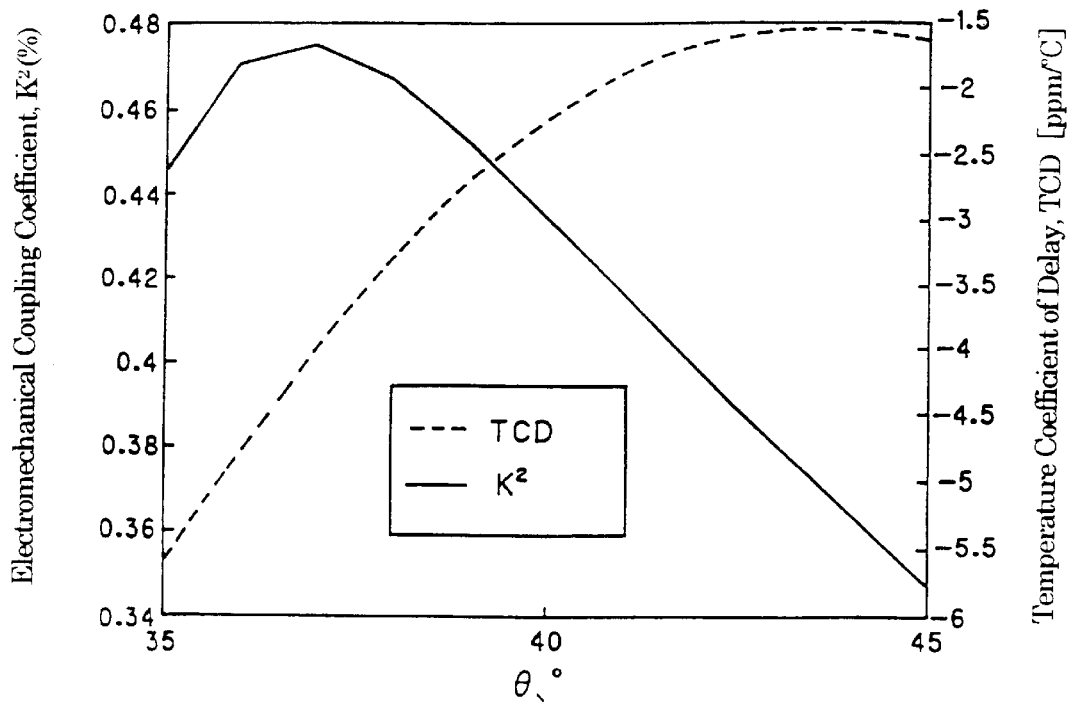
FIG. 3 shows a graph indicating changes in $K^2$ and TCF for a cut face of (180°, 35°–45°, 20°)
Figure 4:
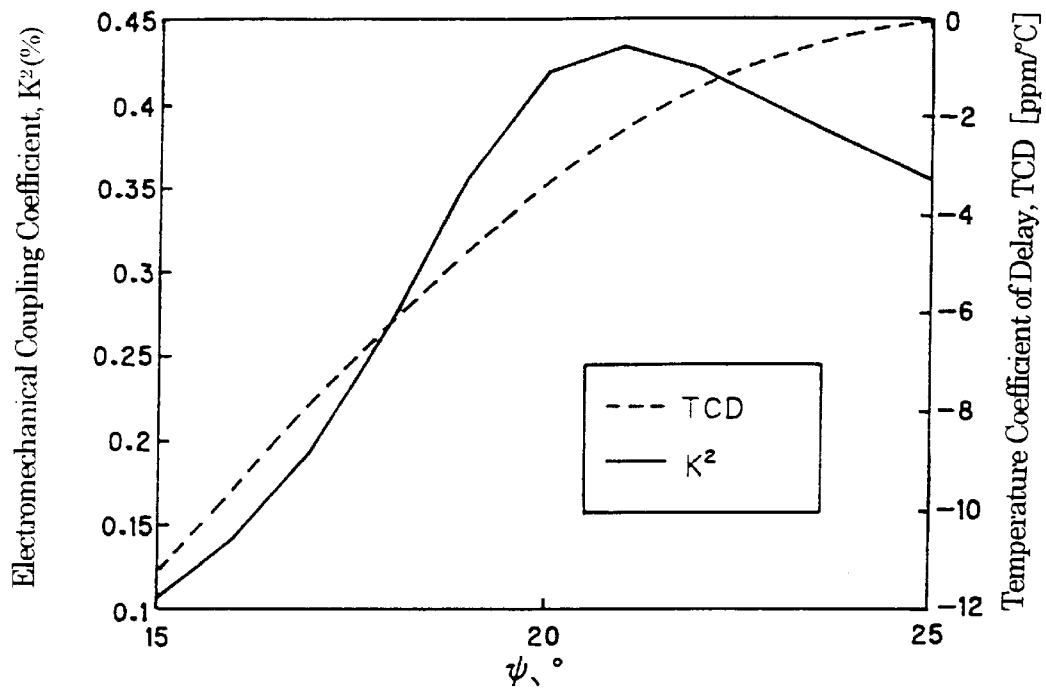
FIG. 4 shows a graph indicating changes in $K^2$ and TCF for a cut face of (180°, 40°, 15°–25°)

According to a first embodiment of the present invention, ranges of angles are obtained which result in an absolute value of TCD of 5 ppm/° C. or less and an electromechanical coupling coefficient K² of 0.3% or more by simultaneously solving Newton's equation of motion, the equation of piezoelectricity, and Maxwell's equation quasi-electrostatically approximated at the surface of the piezoelectric substrate by using the constants shown in Table 1 and Table 2. The cut-face orientation thus obtained is (180°+α, 40°+β, 20°+γ), where α=−2° to +6°, β=−4° to +9°, and γ=−1° to +9°, as shown in FIGS. 2 through 4.

$$TCD=\gamma-(1/V)(\partial V/\partial T) \quad \text{Equation (1)}$$

V: Sound speed of surface acoustic wave at temperature T=25° C.

T: Temperature,

γ: Thermal expansion coefficient of the cut face propagation direction under consideration.

The film thickness h of the electrode material is preferably within a range given by h/λ=0.005 to 0.2, where λ is the wavelength of a surface acoustic wave. Aluminum is suitable as an electrode material, as are other materials such as gold, aluminum+titanium, and aluminum+copper.

The transmission type surface acoustic wave filter shown by the schematic view of FIG. 1 is formed by a photolithography step in a cut face and a propagation direction represented by (180°, 140°, 20°) in Eulerian angles.

Figure 5:
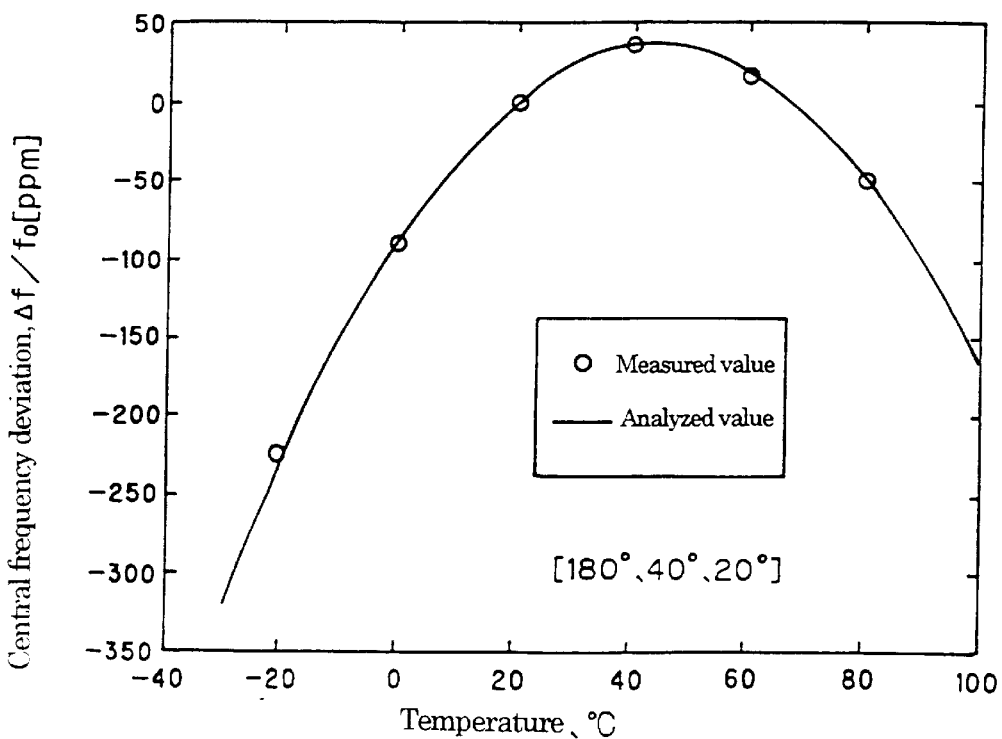
FIG. 5 shows a graph indicating the temperature dependency of a central frequency when $f_o$=20° C.

In this case, the line width and the line interval of the comb-like electrodes are respectively 4 μm. Thirty pairs of electrodes are on the input side and thirty pairs of electrodes are on the output side. The length of the opening of each comb-like electrode is 400 μm. Aluminum is used as the material of the electrode and the film thickness is brought to 2400 angstroms (h/λ=1.5%) by a sputtering process. The element is mounted onto a metal package, and the comb-like electrodes for transmission and reception are coupled to a wire bonded and connected to a network analyzer. Further, when the device is put into a thermostat and a change of a central frequency is measured for a temperature range of −20° C. to 80° C., a characteristic shown by FIG. 5 is obtained and it is confirmed that TCD(=−TCF)=3 ppm/° C. at 25° C.

Figure 8:
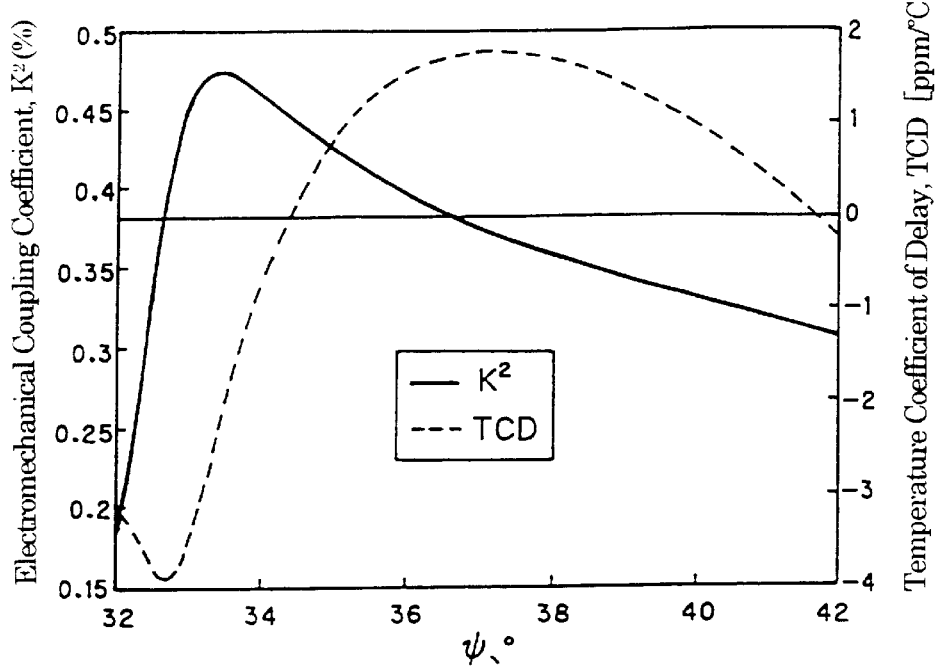
FIG. 8 shows a graph indicating changes in $K^2$ and TCF for a cut face of (10°, 150.5°, 32°–42°)

According to a second embodiment of the present invention, ranges of angles are obtained which result in an absolute value of TCD of 7 ppm/° C. or less and an electromechanical coupling coefficient K² of 0.1% or more by simultaneously solving Newton's equation of motion, equation of piezoelectricity and Maxwell's equation quasi-electrostatically approximated at the surface of the piezoelectric substrate with the constants shown in Table 1 and Table 2. The cut-face orientation thus obtained is (9°+α, 150°+β, 37°+λ), where α=−6° to 6°, β=−5° to 5°, and γ=5° to 5°. The preferred orientation is (13.4°, 150.5°, 37.2°), resulting in TCD=0 ppm/° C. and K²=0.45%, as shown in FIGS. 6 through 8.

Here, TCD is represented by Equation (1), given above. Also, similar to the above-described first embodiment, the film thickness h of electrode material, is preferably within a range of h/λ=0.005 to 0.2 where λ is the wavelength of the surface acoustic wave. Further, aluminum is suitable as an electrode material, as are other materials such as gold, aluminum+titanium, and aluminum+copper.

A pattern of the transmission type surface acoustic wave filter shown by the schematic view of FIG. 1 is formed by a photolithography step in a cut face and a propagation direction represented by (13.4°, 150.5°, 37.2°) in Eulerian angles.

Figure 9:
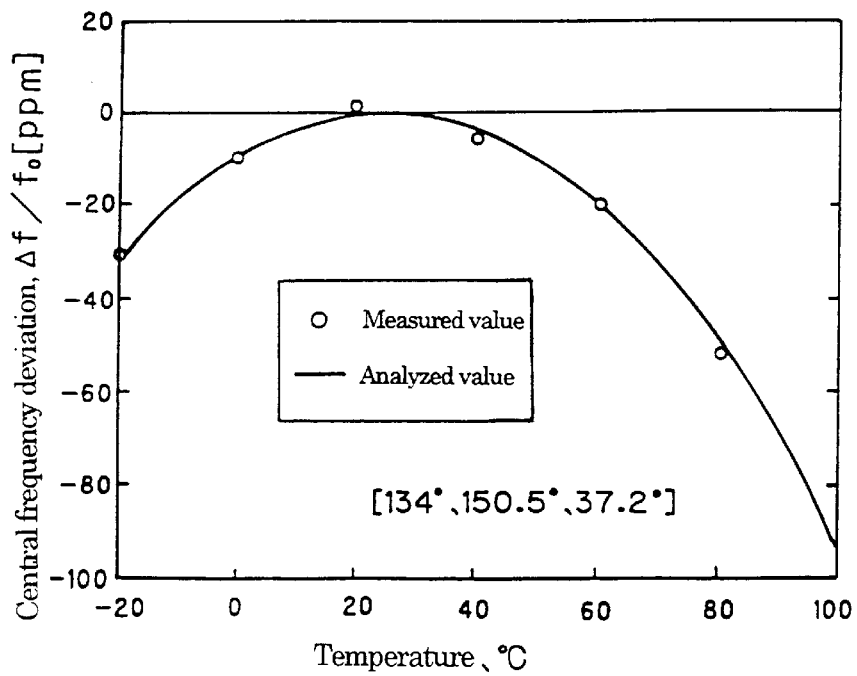
FIG. 9 shows a graph indicating the temperature dependency of a central frequency when $f_o$–25° C.

In this case, the line width and the line interval of the comb-like electrodes are each 4 μm. There are 30 pairs of the electrodes on the input side and 30 pairs of the electrodes on the output side. The length of the opening of the comb-like electrode is 400 μm. The electrode is made of aluminum, and the film thickness is brought to 2400 angstroms (h/λ=1.5%) by a sputtering process. The element is mounted onto a metal package and the comb-like electrodes for transmission and reception are coupled to a wire bonded and connected to a network analyzer. Further, when the device is put into a thermostat and the change of the central frequency is measured in a temperature range of −20° C. through 80° C., a characteristic shown by FIG. 9 is obtained and it is confirmed that TCD(=−TCF) is substantially 0 ppm/° C. at 25° C.

According to a third embodiment of the present invention, by simultaneously solving Newton's equation of motion, the equation of piezoelectricity and Maxwell's equation quasi electrostatically approximated at the surface of piezoelectric substrate by using the constants shown in Table 1 and Table 2, an absolute value of TCD at 25° C. of 5 ppm/° C. or less and an electromechanical coupling coefficient $K^2$ of 0.3% or more are obtained for the following cut-face orientations: (−5° to 5°, 140°, 24°) as shown in FIG. 10; (0°, 135° to 145°, 24°) as shown in FIG. 11; and (0°, 140°, 19° to 29°) as shown in FIG. 12. For a SAW (surface acoustic wave) device, the preferable orientation is (0°, 140°, 24°), resulting in an absolute value of TCD=0 ppm/° C. and $K^2$=0.375%. In this case, TCD is expressed by Equation (1), given above.

Similar to the above-described first embodiment and second embodiment, the film thickness h of the material of the electrode, is preferably within a range of h/λ=0.005 to 0.2 where λ is the wavelength of the surface acoustic wave. The electrode is made of aluminum, but other materials such as gold, aluminum+titanium, and aluminum+copper are also suitable. Further, metals of molybdenum, tungsten and the like are generally suitable.

A pattern of the transmission type surface acoustic wave filter shown by the schematic view of FIG. 1 is formed by a photolithography step in a cut face and a propagation direction represented by (0°, 140°, 24°) in Eulerian angles. The line width and the line interval of the comb-like electrodes are each 4 μm. There are 30 pairs of electrodes on the input side and 30 pairs of electrodes on the output side. The length of the openings of the comb-like electrodes is 400 μm. Aluminum is used as the material of the electrode and the film thickness is brought to 2400 angstroms (h/λ=1.5%) by a sputtering process. The element is mounted onto a metal package and the comb-like electrodes for transmission and reception are coupled to a wire bonded and connected to a network analyzer. Further, when the device is put into a thermostat and the change of the central frequency is measured for a temperature range of −20° C. to 80° C., a characteristic shown by FIG. 13 is obtained and it is confirmed that TCD(=−TCF) at 25° C. is substantially 0 ppm/° C.

This application is based on Japanese Patent Application Nos. HEI 9-68370, HEI 9-69620, and HEI 9-177144 which are incorporated by reference herein.

Obviously, numerous modifications and variations of the present invention are possible in light of the above teachings. It is therefore to be understood that within the scope of the appended claims, the invention may be practiced otherwise than as specifically described herein.

What is claimed is:

1. A surface acoustic wave element comprising:

a single crystal langasite ($La_3Ga_5SiO_{14}$) substrate; and a metal film formed on the single crystal langasite substrate and configured to excite, receive, or reflect a surface acoustic wave, wherein a cut-out angle from the single crystal langasite substrate and a direction of propagating the surface acoustic wave are designated by (180°+α, 40°+β, 20°+γ) in Eulerian angles where α=−2° to +6°, β=−4° to +9°, and γ=−1° to +9°.

2. The surface acoustic wave element according to claim 1, wherein the metal film comprises aluminum.

3. The surface acoustic wave element according to claim 1, wherein the metal film has a thickness h, defined by h/λ=0.005 to 0.2 where λ is the wavelength of the surface acoustic wave.

4. A surface acoustic wave element comprising:

a single crystal langasite ($La_3Ga_5SiO_{14}$) substrate; and a metal film formed on the single crystal langasite substrate and configured to excite, receive, or reflect a surface acoustic wave, wherein a cut-out angle from the single crystal langasite substrate and a direction of propagating the surface acoustic wave are designated by (9°+α, 150°+β, 37°+γ) in Eulerian angles, where +1°<α≦+6°, β=−5° to +5°, and γ=−5° to +5°.

5. The surface acoustic wave element according to claim 4, wherein the cut-out angle of single crystal langasite substrate and the direction of propagating the surface acoustic wave are (13.4°, 150.5°, 37.2°) in Eulerian angles.

6. The surface acoustic wave element according to claim 4, wherein the metal film comprises aluminum.

7. The surface acoustic wave element according to claim 5, wherein the metal film comprises aluminum.

8. The surface acoustic wave element according to claim 4, wherein the metal film has a thickness h, defined by h/λ=0.005 to 0.2 where λ is the wavelength of the surface acoustic wave.

9. The surface acoustic wave element according to claim 5, wherein the metal film has a thickness h, defined by h/λ=0.005 to 0.2 where λ is the wavelength of the surface acoustic wave.

* * * * *

UNITED STATES PATENT AND TRADEMARK OFFICE
CERTIFICATE OF CORRECTION

PATENT NO. : 6,153,961
DATED : November 28, 2000
INVENTOR(S) : Jian et al.

Page 1 of 1

It is certified that error appears in the above-identified patent and that said Letters Patent is hereby corrected as shown below:

<u>Title page,</u>
Item [75] is incorrect, should read as follows:

-- [75] Inventors: Chunyun Jian; Sinicharo Inui, both of Saitama-ken, Japan --

Signed and Sealed this

Twenty-ninth Day of January, 2002

*Attest:*

*Attesting Officer*

JAMES E. ROGAN
*Director of the United States Patent and Trademark Office*